(12) United States Patent
Yoshida et al.

(10) Patent No.: US 8,184,406 B2
(45) Date of Patent: May 22, 2012

(54) THIN FILM MAGNETIC HEAD HAVING AN ANGLED INSULATING FILM

(75) Inventors: Nubuo Yoshida, Kanagawa-ken (JP); Katsuro Watanabe, Ibaragi (JP); Takayoshi Ohtsu, Kanagawa (JP)

(73) Assignee: Hitachi Global Storage Technologies Netherlands BV, Amsterdam (NL)

( * ) Notice: Subject to any disclaimer, the term of this patent is extended or adjusted under 35 U.S.C. 154(b) by 1046 days.

(21) Appl. No.: 11/786,458

(22) Filed: Apr. 10, 2007

(65) Prior Publication Data

US 2007/0253105 A1 Nov. 1, 2007

(30) Foreign Application Priority Data

Apr. 11, 2006 (JP) ................. 2006-108958

(51) Int. Cl.
*G11B 5/147* (2006.01)
*G11B 5/127* (2006.01)

(52) U.S. Cl. .................... 360/320; 360/319; 360/125.02

(58) Field of Classification Search .................. 360/125, 360/319, 320
See application file for complete search history.

(56) References Cited

U.S. PATENT DOCUMENTS

| | | | |
|---|---|---|---|
| 6,967,823 B2 | 11/2005 | Nakamoto et al. | |
| 6,992,870 B2 | 1/2006 | Kagami et al. | |
| 6,995,960 B2 | 2/2006 | Seyama et al. | |
| 7,002,782 B2 | 2/2006 | Hasegawa et al. | |
| 7,522,387 B2 * | 4/2009 | Yoshida | 360/320 |
| 2004/0190205 A1 | 9/2004 | Miyauchi | |
| 2004/0207959 A1 | 10/2004 | Saito | |
| 2006/0012923 A1 * | 1/2006 | Yoshida | 360/323 |

FOREIGN PATENT DOCUMENTS

| | | |
|---|---|---|
| JP | 2002-150513 | 5/2002 |
| JP | 2003-198000 | 7/2003 |
| JP | 2003-298144 | 10/2003 |
| JP | 2003-332649 | 11/2003 |
| JP | 2004-178656 | 6/2004 |
| JP | 2005-011449 | 1/2005 |
| JP | 2005-044490 | 2/2005 |

* cited by examiner

*Primary Examiner* — Brian Miller
(74) *Attorney, Agent, or Firm* — Daphne L. Burton; Burton IP Law Group

(57) ABSTRACT

Embodiments in accordance with the present invention provide a thin film magnetic head for preventing a short-circuit failure during formation of a track portion or a stripe-height portion and improving a yield. In one embodiment, a stripe-height direction is first formed, and then a track-width direction is formed. A third insulating film having a smoothly shaped wall surface is formed on a first insulating film during stripe-height formation. During formation of the third insulating film, an optimized lift-off pattern is used to smooth an edge shape.

5 Claims, 15 Drawing Sheets

Fig. 1
Prior Art
(1-1a)
(1-1b)
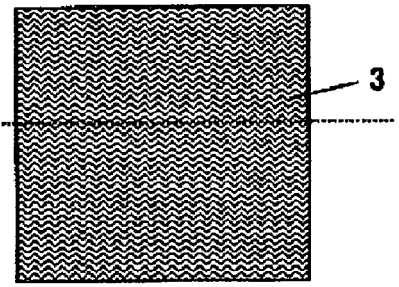
(1-2a)
(1-2b)
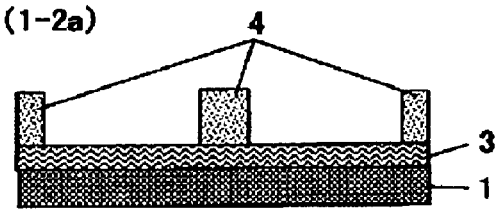
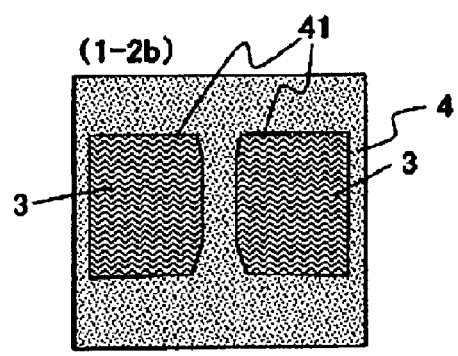
(1-3a)
(1-3b)
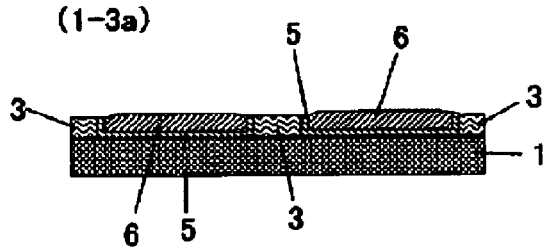
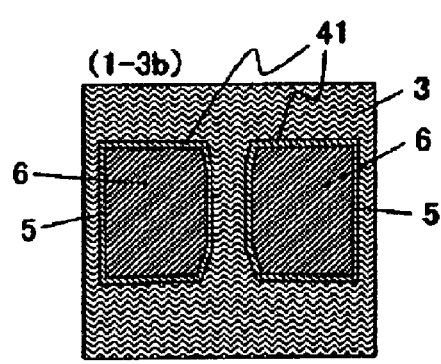
(1-4a)
(1-4b)
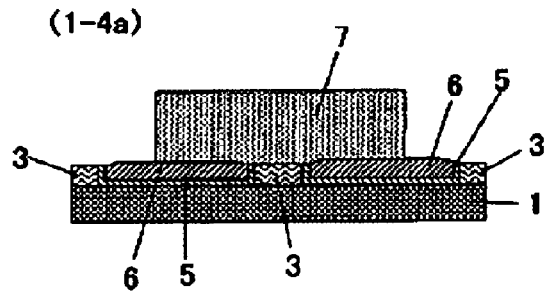
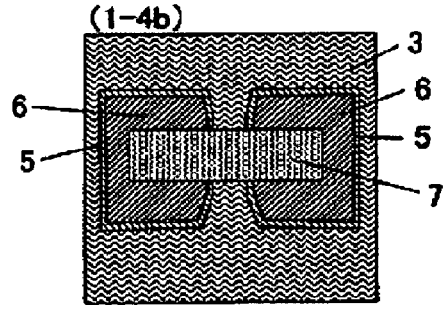

Fig. 2
Prior Art
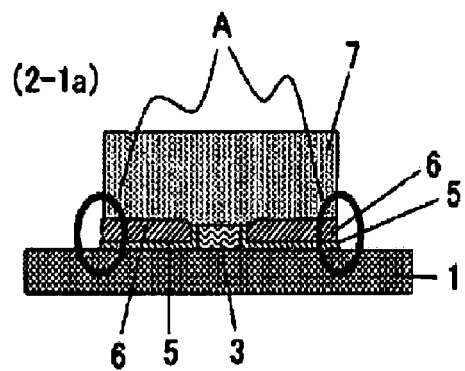
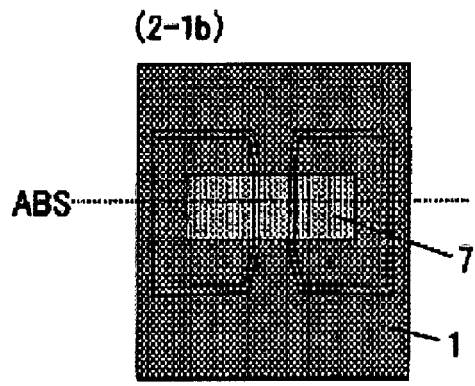
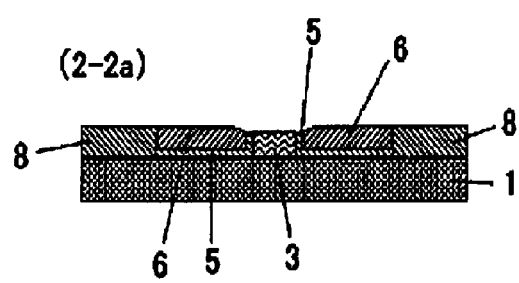
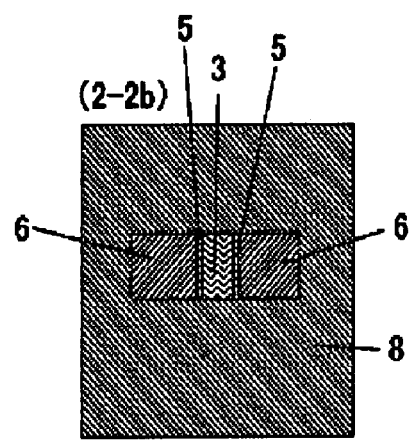
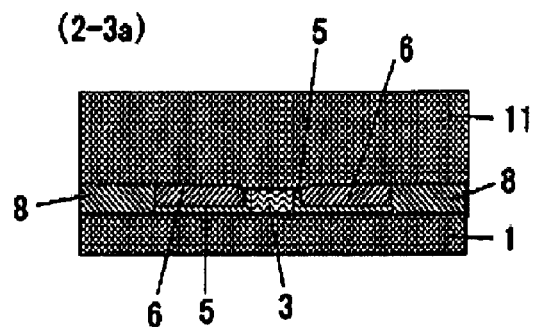

Fig. 6
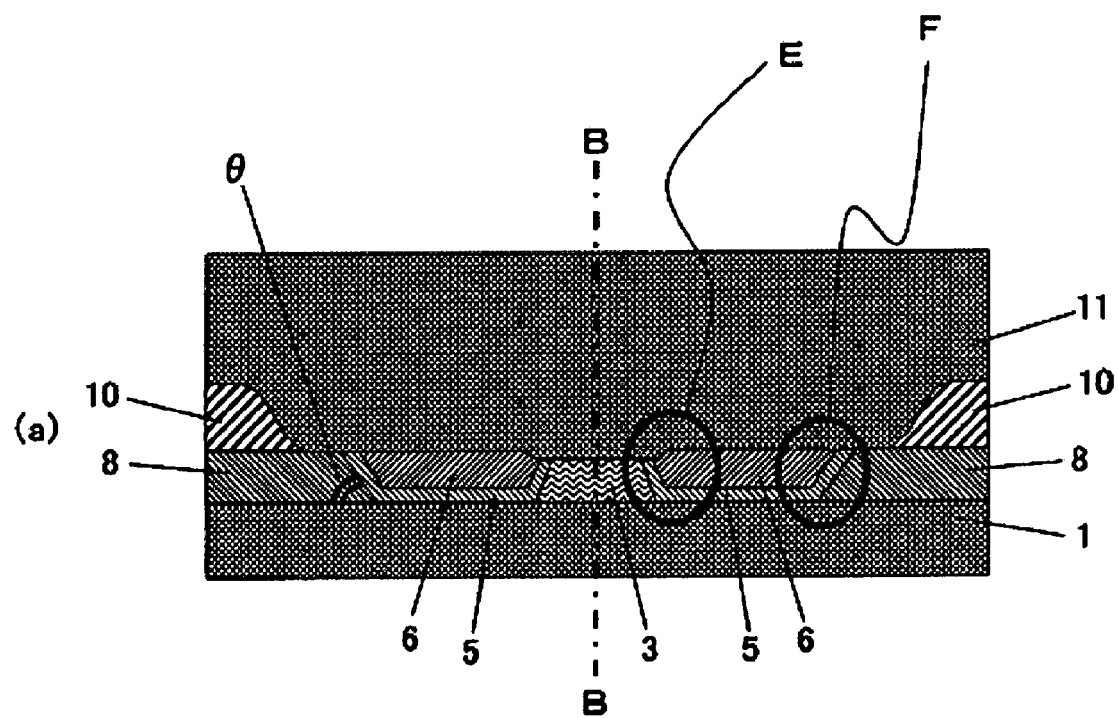
(a)
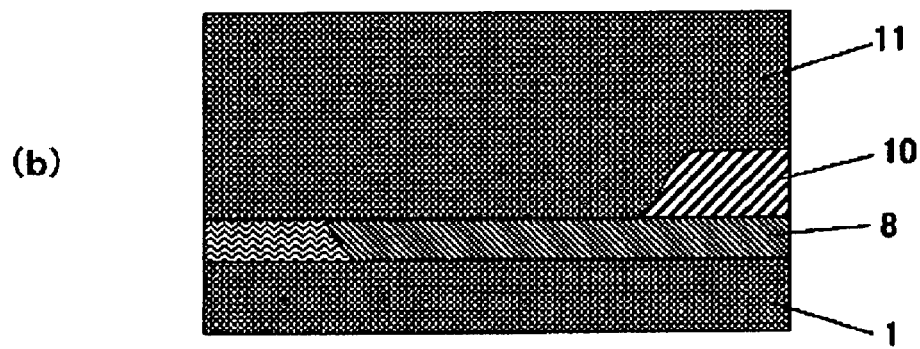
(b)

THIN FILM MAGNETIC HEAD HAVING AN ANGLED INSULATING FILM

CROSS-REFERENCE TO RELATED APPLICATION

The instant nonprovisional patent application claims priority to Japanese Patent Application 2006-108958, filed Apr. 11, 2006, which is incorporated by reference herein for all purposes.

BACKGROUND OF THE INVENTION

In accordance with the trend of the high recording density of an HDD, a thin film magnetic head to be mounted is requested to a narrower track width and a narrow gap length and allow high sensitivity. Normally, the thin film magnetic head uses a combination of a write head and a read head. Presently, the mainstream of the read head is a GMR head using the GMR effect. The GMR head is a CIP (Current In Plane) head that supplies an electric signal to a sensor film parallel with a film surface. The need for further improving the recording density promotes the development of a TMR (Tunneling MagnetoResistive effect) and a CPP-GMR (Current Perpendicular to a Plane-Giant MagnetoResistive effect) head that are considered to be advantageous to realizing a high output as well as a narrow track width and a narrow gap length. Unlike conventional GMR heads, the TMR head and the CPP-GMR head are not a CIP-type head that applies a sensing current parallel to the film surface, but a CPP-type head that applies a sensing current perpendicularly to the film surface.

JP-A No. 198000/2003 describes the CPP-GMR that is a CPP-type head. According to this publication, a convex lower lead makes contact with a sensor film. An upper lead is configured to use a smaller width for contact with the sensor film than that needed for the lower lead so as to improve an alignment margin and form a minute contact portion. JP-A No. 298144/2003 describes the head having a convex lower lead similar to that described in JP-A No. 198000/2003. The head uses a flattened convex portion and makes it possible to fabricate a uniform sensor film so as to improve characteristics.

JP-A No. 11449/2005 proposes thinning a domain control film disposed at the side of a sensor and reducing a shield gap. Narrowing the shield gap at the side of the sensor aims at decreasing side-reading. JP-A No. 178656/2004 discloses the structure having the side shield for a similar purpose of reducing side-reading. JP-A No. 332649/2003 aims at magnetic stability of a sensor film and reduction of side-reading. JP-A No. 44490/2005 considers the magnetic stabilization of a pinned layer and proposes forming the pinned layer so that its size in the stripe-height direction becomes greater than the size in the track width.

A CPP-type head uses upper and lower shields as magnetic shields and also uses them as electrodes. An insulating film is disposed on a wall surface of a sensor film. An electrode is disposed over and below the sensor film surface. An electric current is applied perpendicularly to the film surface. In terms of a fabrication process, the track width is first formed, and then the stripe-height is formed. The same applies to JP-A No. 11449/2005 and JP-A No. 44490/2005.

With reference to FIGS. 1 and 2, the following describes an example of the fabrication process of a conventional CPP-type head.

(1-1) First, a sensor film 3 such as a TMR film is formed on a lower shield 1. FIG. (1-1a) is a cross sectional view taken along the ABS line in plan view (1-1b). The same applies to the subsequent diagrams.

(1-2) A track formation resist mask 4 is then formed for forming a track. The track formation resist mask 4 has an opening for an etching area for track forming 41.

(1-3) The track formation resist mask 4 is used as an etching mask to etch the sensor film 3 for the etching area for track forming 41. In order to ensure the insulation of a sensor wall surface, there are formed a second insulating film 5 and a magnetic film 6 functioning as a domain control film. Then, a lift-off process is performed to remove unnecessary parts of the second insulating film 5 and the magnetic film (domain control film) 6. As a result, only the etching area for track forming 41 contains the second insulating film 5 and the magnetic film (domain control film) 6. The second insulating film 5 ensures the insulation in the vicinity of the track.

(1-4) A stripe-height formation resist mask 7 is formed to prescribe the stripe-height direction of the sensor film 3.

(2-1) The stripe-height formation resist mask 7 is used as an etching mask to etch the sensor film 3. The second insulating film 5 and the magnetic film (domain control film) 6 are also etched simultaneously. At this time, etching edges A are formed for the second insulating film 5 and the magnetic film (domain control film) 6.

(2-2) With the stripe-height formation resist mask 7 provided, a first insulating film 8 is formed and is lifted off to leave the first insulating film 8 only at an etched portion of the stripe-height formation resist mask 7.

(2-3) An upper shield 11 is formed.

In the future, it may be necessary to not only improve the recording density, but also to increase a signal frequency. Eventually a narrower gap length may decrease a distance between the upper and lower shields as electrodes to increase the electrostatic capacity between the upper and lower shields as electrodes. Not only the distance, but also an electrode area influences the electrostatic capacity. Increasing the electrode area increases the electrostatic capacity. Increasing the electrostatic capacity may degrade high frequency characteristics. Unlike the CIP head, the CPP-type head uses electrodes for the upper and lower shields. The problem becomes more serious. To avoid this problem, JP-A No. 178656/2004 describes an example of forming another insulating film (gap layer) on an insulating film (equivalent to the second insulating film 5 in FIG. 1) for the track formation portion.

It is known that a fabrication process for forming insulating films uses the lift-off process and the etching process. Such fabrication process greatly influences yields and is empirical in many cases.

For example, let us consider a case of forming an insulating film 10 for the CPP-type head as shown in FIG. 4. FIG. 3 shows an example of using the lift-off process for the fabrication process for forming the insulating film 10. Similarly to FIG. 1, FIG. 3 shows plan views and sectional views.

(3-1) There is shown a diagram after the head is processed in the track-width direction and the stripe-height direction.

(3-2) A resist pattern 9 is formed for forming a third insulating film 10.

(3-3) The third insulating film 10 is formed thereon.

(3-4) The lift-off process is performed to remove unnecessary parts of the third insulating film 10 and the resist pattern 9.

(3-5) The upper shield 11 is formed to complete the head.

The lift-off process is also used for track formation resist mask pattern shapes are disclosed. With respect to the track formation of the CPP-type head structure in accordance with the lift-off process, JP-A No. 332649/2003 discloses the eaves-shaped cross-section whose lift-off pattern has an undercut.

A CPP-type head uses upper and lower shields as magnetic shields and also uses them as electrodes. An insulating film is disposed on a wall surface of a sensor film. An electrode is disposed over and below the sensor film surface. An electric current is applied perpendicularly to the film surface. Vertically applying an electric current may generate an unnecessary electric current path between the upper and lower leads, i.e., a short-circuit or the like. This is undesirable. Decreasing an isolation voltage between the upper and lower leads increases the probability of short-circuit failure occurrence. As a result, this causes a yield to decrease. Eventually a narrower gap length tends to further decreasing a distance between the shields. It is expected to further increase a possibility of causing a short-circuit and decreasing an isolation voltage.

The following problem is suspected when the head is fabricated first in the track-width direction and then in the stripe-height direction as mentioned with reference to FIGS. 1 and 2. After the head is processed in the track-width direction, the insulating film and the domain control film are formed. Then, the head is processed in the stripe-height direction. In this case, the domain control film and the insulating film may be often cut simultaneously. When re-deposition from the lower shield deposits on the insulating film, the lower shield and the domain control film short-circuit. As a result, the short-circuit propagates to the upper shield on the domain control film. Consequently, the lower shield and the upper shield short-circuit.

This will be described in more detail with reference to FIGS. 1 and 2. In (1-3), only the etching area for track forming 41 is provided with the second insulating film 5 and the magnetic film (domain control film) 6. Generally, the second insulating film 5 is very thin such as 10 nm or less in some cases so that the magnetic film (domain control film) 6 can function effectively. The thin second insulating film 5 ensures insulation near the track. In (2-1), the sensor film 3 is etched using the stripe-height formation resist mask 7 as an etching mask. The second insulating film 5 and the magnetic film (domain control film) 6 are etched simultaneously. At this time, etching edges A are formed for the second insulating film 5 and the magnetic film (domain control film) 6. When re-deposition from the lower shield 1 is formed on the second insulating film 5, the lower shield 1 and the magnetic film (domain control film) 6 short-circuit. Part of the reason for the short-circuit is a very small thickness of the second insulating film 5 that is formed simultaneously with the magnetic film (domain control film) 6. As the second insulating film 5 thins, the possibility increases. Thickening the film can decrease the possibility of short-circuiting. In such case, however, the distance between the sensor film and the domain control film increases to degrade the effect of the domain control film and cause a characteristic failure.

Accordingly, it is important to both prevent short-circuiting and stabilize characteristics using the domain control film. It is difficult to find a satisfactory condition for both. When the upper shield 11 is finally formed and the problem described in (2-1) occurs, the lower shield 1 and the upper shield 11 short-circuit to cause a fatal characteristic failure such as decreased output.

When that manufacturing sequence is used to form the head, the width of the magnetic film (domain control film) 6 in the stripe-height direction on the wafer almost equals the sensor film. After lapping of air bearing surface (ABS), the sensor film 3 has a stripe-height of approximately 100 nm to approximately 200 nm. The height becomes much lower than that in a wafer process. That is, the magnetic film (domain control film) 6 also reduces greatly. When a magnetic film such as the magnetic film (domain control film) 6 is subject to reduction in its cubic volume, the magnetic stability degrades. The manufacturing sequence causes the magnetic film (domain control film) 6 to be unstable and may degrade head characteristics. The stripe-height is expected to be much lower and the influence is expected to increase.

A similar problem is expected when a side-shield film is used as the magnetic film 6 instead of the domain control film. The side-shield film needs to absorb an unnecessary magnetic field at a sensor film side. When the head is formed as mentioned above, however, it becomes horizontally long, i.e., very narrow in the stripe-height direction and wide in the track-width direction. In such case, too excessive a shape anisotropy is expected to occur. That is, the side-shield film magnetization may be fixed in the track-width direction to nullify the full functionality of the side shield. As a result, an effect of reducing side-reading degrades to decrease an effect of improving the recording density.

On the other hand, this manufacturing sequence may cause another problem than that mentioned above. This will be described with reference to FIG. 5. FIG. 5 shows that the stripe-height formation resist mask 7 is formed after the track formation. FIG. 5($a$) is a plan view. FIG. 5($b$) is a cross sectional view taken on the line a-a in FIG. 5($a$). It is a common practice to adjust the thickness of the magnetic film 6 (domain control film) during track formation so as to stabilize sensor film characteristics. When the top surface of the magnetic film 6 (domain control film) becomes higher than the sensor film 3 (FIG. 5($b$)), a shape defect occurs for the stripe-height formation resist mask 7 that is subsequently formed in region E of FIG. 5($a$). The region E in FIG. 5($a$) is concave and therefore causes a shape defect for the stripe-height formation resist mask 7 due to a non-uniform thickness in the applied resist film or halation during the photolithography.

When the stripe-height formation resist mask 7 is subject to a shape defect as shown in the drawing, a shape defect occurs in the stripe-height direction of the sensor film 3 and the dimensional accuracy degrades. An edge position in the stripe-height direction of the sensor film 3 becomes a base point to ABS (throat-height zero point) for the read head after the lapping of ABS. The accuracy of this reference position also degrades. Degradation of the reference positional accuracy also leads to degradation of the positional accuracy for a write head to be used in combination. This is because the positional accuracy of a magnetic pole constituting the write head largely depends on the edge positional accuracy in the stripe-height direction of the sensor film 3. When the edge positional accuracy degrades in the stripe-height direction of the sensor film 3, a fluctuation occurs in the length in the stripe-height direction of the magnetic pole constituting the write head after the lapping of ABS. As a result, the write head performance also fluctuates.

It is important to accurately form the stripe-height direction of the read head that specifies the reference position in the stripe-height direction.

The structure in FIG. 1 or 2 can be protected against short-circuiting by forming a third insulating film after processing in the track-width direction and the stripe-height direction and covering the third insulating film up to the inside of an external edge (portion A in 2-1) for the track forming portion. This will be described with reference to FIG. 3. At region B indicated by (3-2), the upper insulating film pattern intersects the outside of the stripe-height forming portion. Halation occurs at that portion to disorder the pattern. This may leave lift-off remainders or cause a shape defect for the upper shield to be formed later.

As shown in FIG. 3, the magnetic film 6 is disposed at the side of the sensor film via the second insulating film 5 during the track width formation. Many structures dispose the side-shield film or the domain control film as the magnetic film 6. According to the structure as shown in FIG. 3, the third insulating film 10 covers the external edge region of the side shield or the domain control film. Therefore, a distance between the magnetic film 6 and the upper shield varies near and away from the sensor. This will be described with reference to FIG. 4. FIG. 4 shows the same state as FIG. 3 (3-5). Since the third insulating film 10 is provided, the distance between the magnetic film 6 (the side-shield film or the domain control film) and the upper shield is small at region C. The distance at region D increases for the thickness of the third insulating film 10. As a result, when the magnetic film 6 is the domain control film, a magnetic flux generated from the domain control film is absorbed into the shield to cause a non-uniform distribution. There may be a possibility of an unfavorable effect such as generation of a magnetic domain wall on the shield and the sensor film. A similar problem may occur when the magnetic film 6 is the side shield. When a distance between the side-shield film and the upper shield varies depending on regions C and D, the side shield causes a non-uniform magnetic action or field distribution in relation to the upper shield. This may adversely affect the side shield and the upper shield.

To improve high frequency characteristics, JP-A No. 178656/2004 mentioned above proposes an example of forming another insulating film (gap layer) on the insulating film (equivalent to the second insulating film in FIG. 1) in the track formation portion. That is, the distance between the upper and lower shields as electrodes is increased to decrease the electrostatic capacity. However, JP-A No. 178656/2004 places stress only on the ABS shape and the side shield structure. Stress is placed only on the ABS shape in terms of the gap layer. There is no mention on processing in the stripe-height direction. When the sensor film is processed for a magnetic head, only processing the track width and the stripe-height can first provide a shape functioning as the sensor. It is very important to establish the structure and the process in consideration for both. The gap layer as disclosed in JP-A No. 178656/2004 makes contact with the upper shield and is preferably smoothly shaped. In many cases, the gap layer has a thickness of several hundreds of nanometers for ensuring an isolation voltage. Stably forming the upper insulating film having such thickness and shape is important for stabilizing shield characteristics and improving an isolation voltage yield. However, JP-A No. 178656/2004 makes no mention of a formation method. Fabricating a stable head remains unclear. JP-A No. 11449/2005 and JP-A No. 44490/2005 provide no description about such insulating film itself.

Methods of forming the insulating film include the lift-off process as shown in FIG. 3. The lift-off process may vary shapes, stability, and ease of fabricating depending on a resist film thickness or constitution. FIG. 3, (3-2) and (3-3), shows the pattern having a vertical wall surface as the resist pattern 9 for forming the third insulating film 10. When this shape is used actually, performing the lift-off process after forming the third insulating film 10 causes lift-off remainders at edges of a boundary between the resist pattern 9 and the third insulating film 10. A shape defect results.

An etching process may be another method of forming the third insulating film. However, the upper surface of the sensor film 3 is also subject to the etching process and may be damaged accordingly. As mentioned above, the lift-off process may be used to form the third insulating film. For example, let us consider that the pattern is used according to the same resist film thickness and shape as for the track formation. Such pattern construction makes the lift-off process difficult if the pattern is used for the process to form the third insulating film. The pattern cannot be used as the resist pattern 9. The reason follows. The track formation is one of finest magnetic head processes. The resist pattern film is very thin and an undercut width is very small.

BRIEF SUMMARY OF THE INVENTION

Embodiments in accordance with the present invention provide a thin film magnetic head for preventing a short-circuit failure during formation of a track portion or a stripe-height portion and improving a yield. In one specific embodiment shown in connection with FIG. 6, a stripe-height direction is first formed, and then a track-width direction is formed. A third insulating film 10 having a smoothly shaped wall surface is formed on a first insulating film 8 during stripe-height formation. During formation of the third insulating film 10, an optimized lift-off pattern is used to smooth an edge shape.

For a more complete understanding of the present invention, reference is made to the following detailed description taken in conjunction with the accompanying drawings.

BRIEF DESCRIPTION OF THE DRAWINGS

FIG. 2 is an explanatory diagram showing a fabrication process for a conventional CPP-type head.

FIG. 6 is a diagram showing an embodiment of a read head according to an embodiment of the present invention.

FIG. 12 is a schematic diagram showing a state before an optimized lift-off pattern is lifted off.

FIG. 13 is a schematic diagram showing a shape of a third insulating film.

FIG. 15 is a schematic diagram showing a magnetic disk unit.

FIG. 16 is a diagram showing a modification of the read head according to an embodiment of the present invention.

DETAILED DESCRIPTION OF THE INVENTION

Figure 3:
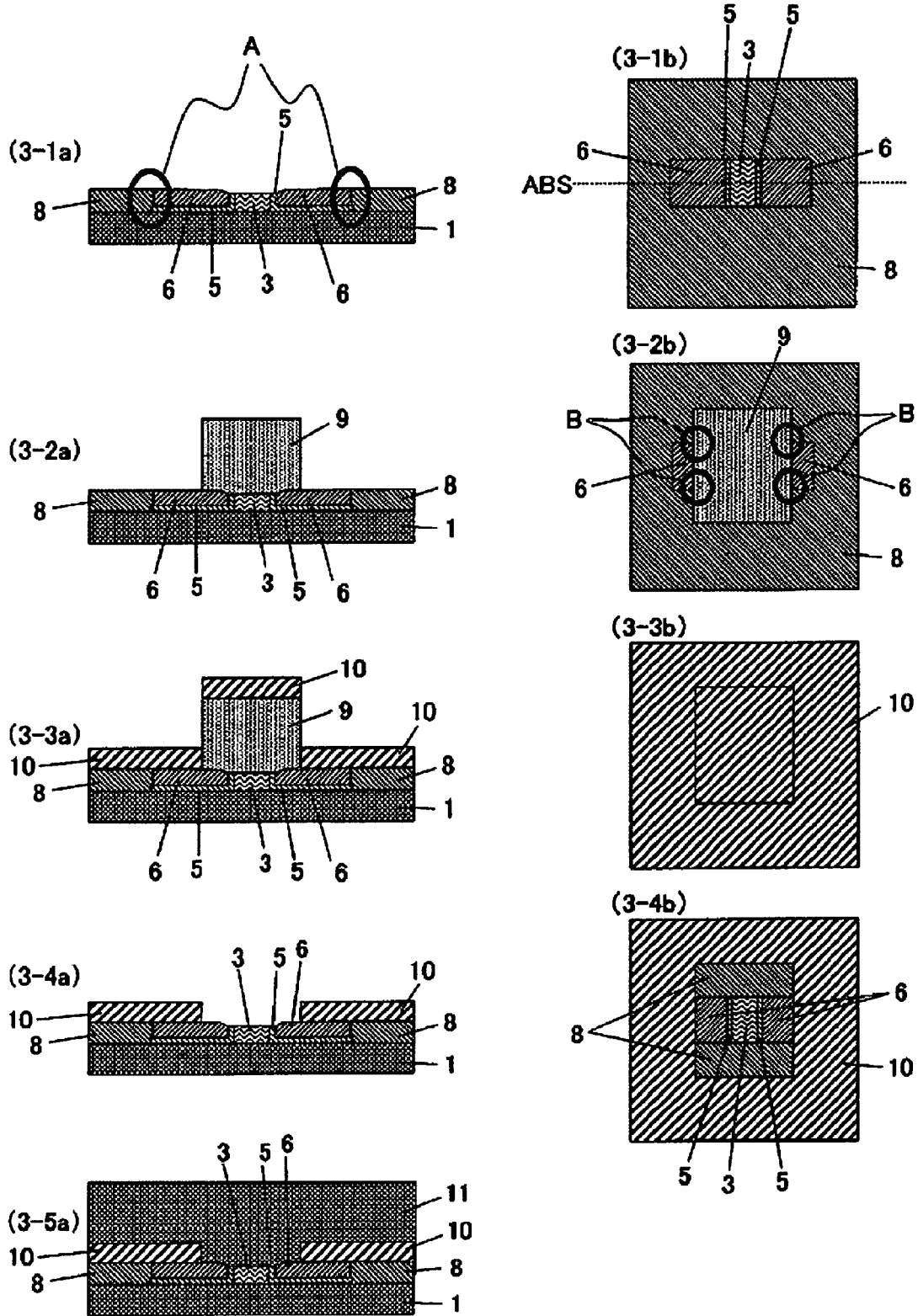
FIG. 3 is an explanatory diagram showing a fabrication process for a conventional CPP-type head.

Embodiments in accordance with the present invention relate to a thin film magnetic head used for a magnetic disk storage. More specifically, the invention relates to a thin film magnetic head used for reading.

It is an object of an embodiment of the present invention to prevent a short-circuit failure during formation of a track portion and a stripe-height portion and improve a yield.

A magnetic head according to an embodiment of the present invention is a CPP-type magnetic head and includes: a pair of second insulating films formed adjacently to both sides of the sensor film in a track-width direction; a pair of magnetic films that are formed at both sides of the sensor film in the track width direction and are adjacent to the second insulating film; a first insulating film disposed outside the second insulating film in a track width direction of the sensor film; and a third insulating film disposed between the upper shield and the first insulating film. In terms of shapes on an ABS, the second insulating film is also adjacent to both wall surfaces of the pair of magnetic films and the third insulating film is disposed outside the second insulating film. The pair of magnetic films may be hard-magnetic films or soft-magnetic films. An outside edge of the second insulating film forms an angle of 90° or smaller with reference to the lower shield on the ABS. The third insulating film has no corner at an upper shield side.

The CPP-type magnetic head according to the invention is fabricated by performing a process for defining a stripe-height of the sensor film to form the first insulating film, performing a process for defining a track width of the sensor film to form a pair of second insulating films and a pair of magnetic films, and then forming the third insulating film.

Embodiments in accordance with the present invention can prevent a CPP-type magnetic head against a shape defect and a short-circuit failure.

Embodiments in accordance with the present invention will be described. Basically, the thin film magnetic head according to the invention is used as a read head in combination with a write head. Unless otherwise specified, the write head portion is omitted and only the read head portion will be described.

FIG. 6 shows an embodiment of the read head according to the invention. FIG. 6 schematically shows the vicinity of a sensor film of a CPP-type thin film magnetic head according to an embodiment of the present invention. FIG. 6(a) shows a shape on an ABS. FIG. 6(b) is a cross sectional view taken on the line B-B in FIG. 6(a).

As shown in FIG. 6(a), the sensor film 3 is disposed on the lower shield 1 also used as an electrode. A pair of second insulating films 5 are disposed adjacently to both sides of the sensor film 3 in the track-width direction. The second insulating film 5 ensures insulation of a wall surface of the sensor film 3. The magnetic film 6 is disposed on the second insulating film 5. When the magnetic film 6 is formed into a hard-magnetic film, the magnetic film 6 functions as a domain control film. When the magnetic film 6 is formed into a soft-magnetic film, the magnetic film 6 functions as a side-shield film. The first insulating film 8 is disposed outside the second insulating film 5. The third insulating film 10 is disposed on the first insulating film 8, i.e., outside the second insulating film. The upper shield 11 is disposed thereon. In FIG. 6(a), the third insulating film 10 provides a right-and-left interval of 1.5 μm to 15 μm and an interval of 1 μm to 10 μm in the stripe-height direction.

According to an embodiment of the present invention, the second insulating film 5 at portion F in FIG. 6 greatly differs from the shape of portion A in FIG. 2. That is, the second insulating film 5 is raised toward the upper shield 11. In other words, angle θ at an outside edge of the second insulating film 5 ranges from approximately 0° to approximately 90° with reference to the lower shield in contact with the first insulating film 8. While the edge is tapered straight in FIG. 6, the edge may be tapered in multiple steps or may contain a curved portion.

Figure 4:
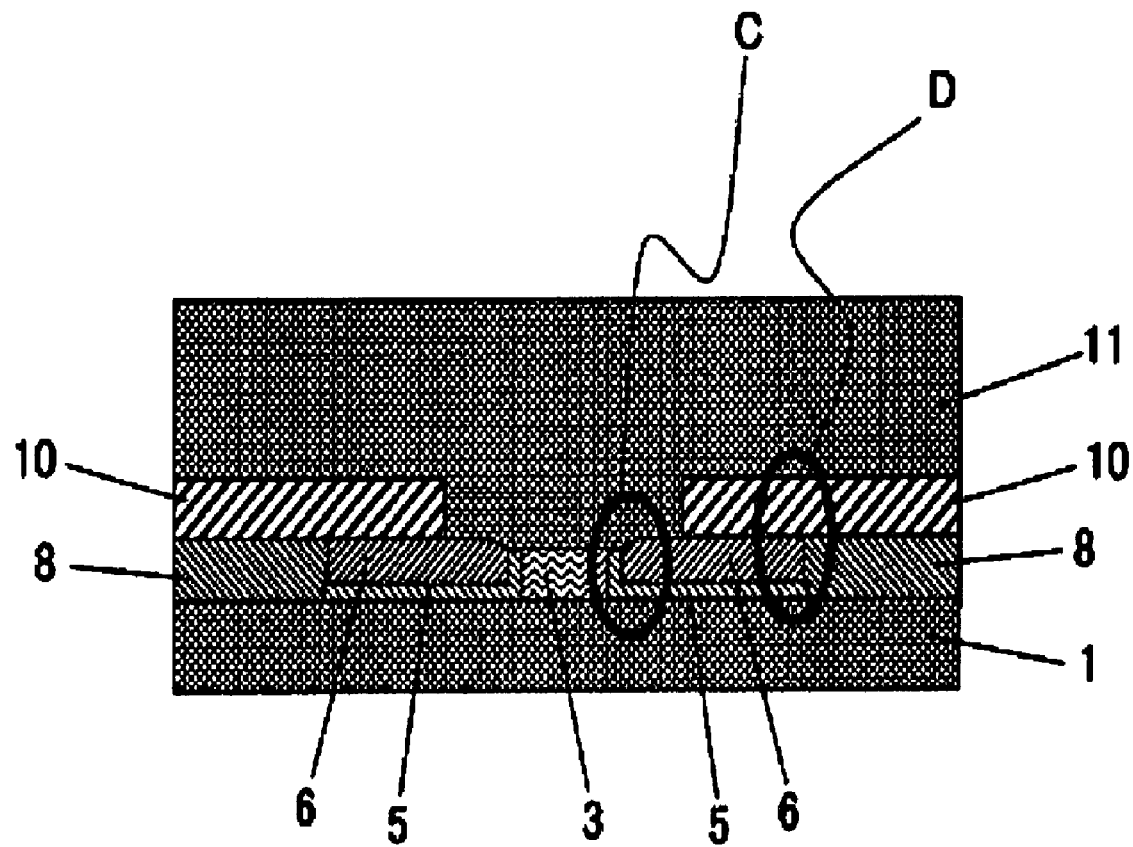
FIG. 4 is a diagram showing a conventional CPP-type head.

As will be understood, FIG. 6 differs from FIG. 4 in that the third insulating film 10 is disposed on the first insulating film 8, i.e., outside the second insulating film. When the domain control film is used as the magnetic film 6, distances between the magnetic film 6 (domain control film) and the upper shield 11 are different at portions C and D in FIG. 4. Distances between the magnetic film 6 (domain control film) and the upper shield 11 are unchanged at portions E and F in FIG. 6. This improves the uniformity of distribution of a magnetic flux that is generated from the domain control film and is absorbed into the shield. It is possible to decrease occurrences of a magnetic domain wall on the shield or the sensor film. When the side-shield film is used as the magnetic film 6, the same distance is maintained between the magnetic film 6 (side-shield film) and the upper shield 11. This improves a magnetic action between the magnetic film 6 (side-shield film) and the upper shield or the uniformity of magnetic field distribution. It is preferable to taper the magnetic film 6 (side-shield film) at portion F so as to be able to decrease unnecessary magnetization states at the edge of the magnetic film 6 (side-shield film). As the magnetic film edge approximates to a rectangular shape, a strong magnetic pole component develops at the edge. The consequence is to decrease the effect of the magnetic film 6 (side-shield film) functioning as a magnetic shield. Therefore, the tapered shape improves the side shield effect.

The shape of the upper shield 11 toward the lower shield 1 largely depends on the third insulating film 10. When the third insulating film 10 is shaped as shown in FIGS. 3 and 4, the shape of the upper shield 11 toward the lower shield 1 has a cornered vertical wall surface. When the upper shield 11 is shaped like this, a magnetic domain wall occurs at corners to cause a characteristic failure. This effect is especially remarkable on a CPP-type magnetic head because the upper and lower shields are electrodes. The third insulating film 10 in FIG. 6 is shaped differently from the third insulating film 10 as shown in FIGS. 3 and 4. The third insulating film 10 in FIG. 6 decreases corners and perpendicular portions and is void of a vertical wall surface. In more detail, it is more preferable to taper the third insulating film 10 and smoothly vary the corner for varying an angle. The third insulating film 10, as shaped in this manner, tapers the upper shield 11 toward the lower shield 1 and provides a smooth angle. As a result, it is possible to prevent the upper shield 11 from generating a magnetic domain wall and stabilize characteristics.

Since the third insulating film 10 is disposed outside the second insulating film 5, this structure makes it possible to effectively use the function of the magnetic film 6 whether it is a domain control film or a side-shield film. Since the third insulating film 10 is disposed outside the second insulating film 5, this structure does not cover the edge differently from portion D in FIG. 4, leaving a possibility of short-circuiting. However, the invention employs the structure as if the second insulating film 5 goes aground the first insulating film 8. The fabrication process does not etch the second insulating film 5. It is possible to prevent short-circuiting even though the third insulating film 10 does not cover portion F in FIG. 6.

Figure 7:
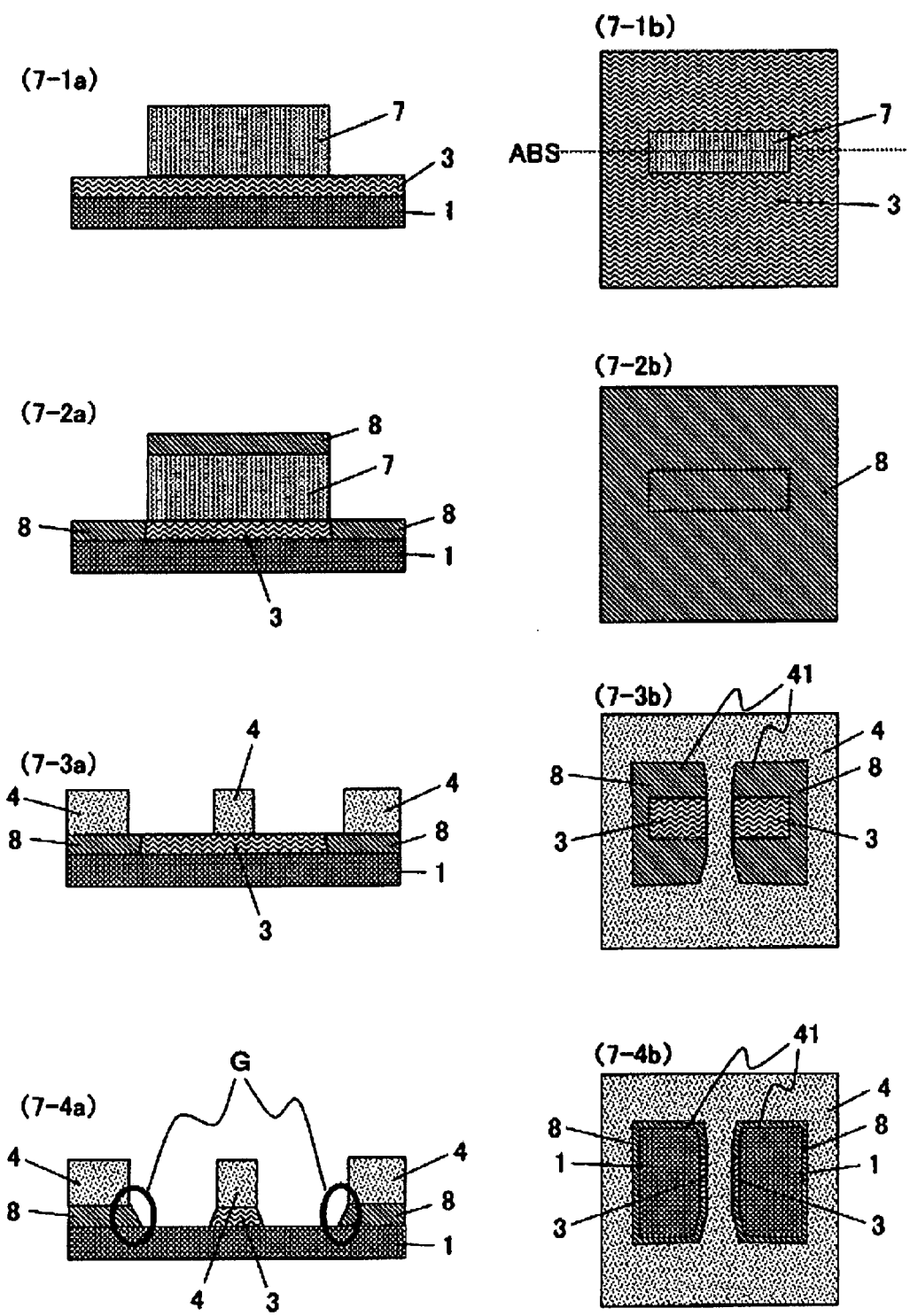
FIG. 7 is a diagram exemplifying the fabrication process of the read head according to an embodiment of the present invention.
Figure 8:
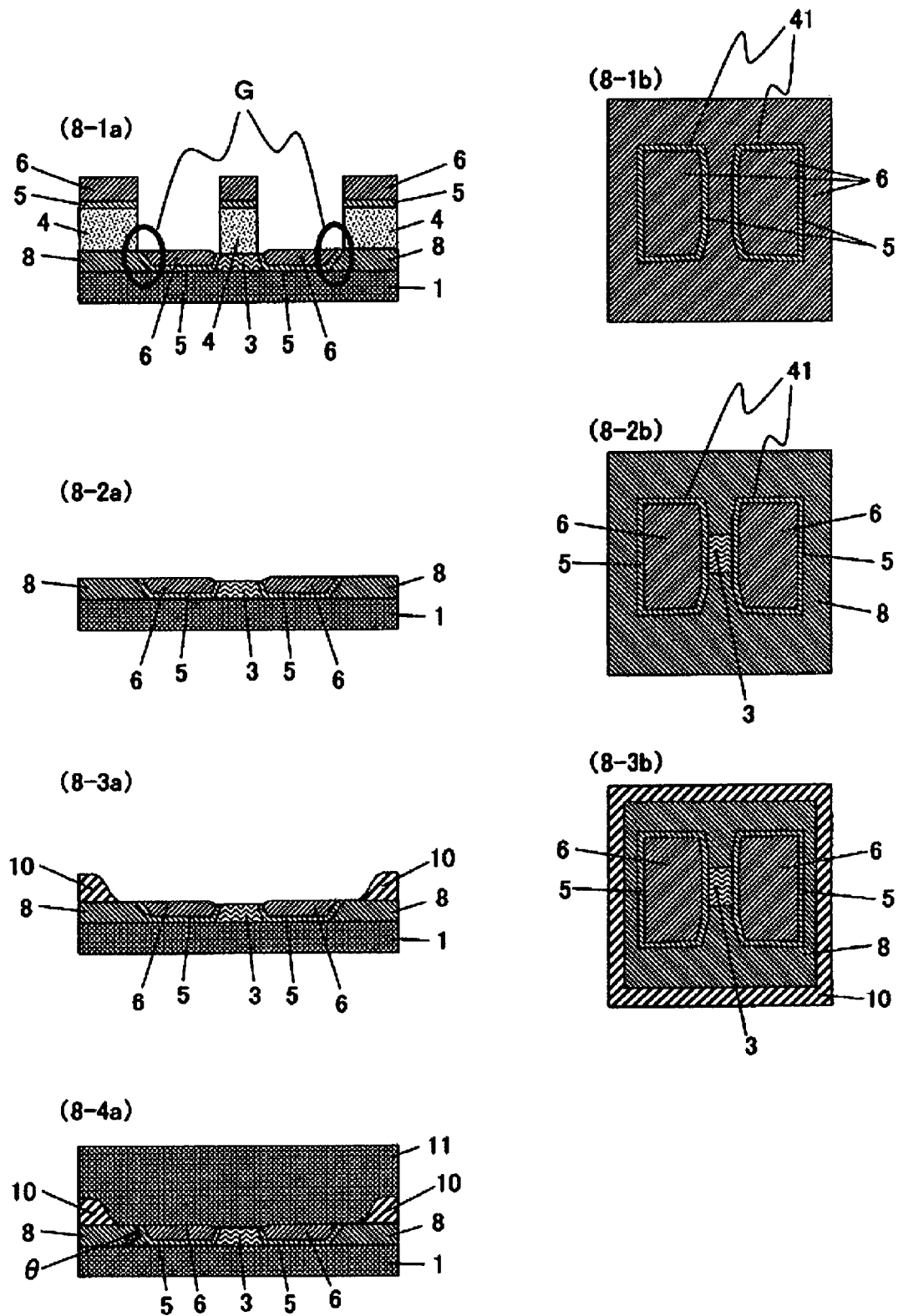
FIG. 8 is a diagram exemplifying the fabrication process of the read head according to an embodiment of the present invention.

FIGS. 7 and 8 show another embodiment of the present invention. The embodiment exemplifies the read head fabrication process according to the present invention.

(7-1) The sensor film 3 such as a TMR film is formed on the lower shield 1. The stripe-height formation resist mask 7 is then formed. FIG. (7-1*a*) is a cross sectional view taken along the ABS line in plan view (7-1*b*). The same applies to the subsequent diagrams.

(7-2) The stripe-height formation resist mask 7 is used as an etching mask to etch the sensor film 3. While the stripe-height formation resist mask 7 remains, the first insulating film 8 is formed. Though not shown, the lift-off process is then performed to dispose the first insulating film 8 corresponding only to the etching portion for the stripe-height formation resist mask 7.

(7-3) The track formation resist mask 4 is formed.

(7-4) The track formation resist mask 4 is used as an etching mask to etch the sensor film 3 in the etching area for track forming 41. The first insulating film 8 is simultaneously etched to form an etching edge G of the first insulating film 8 as shown in FIG. (7-4*a*).

(8-1) While the track formation resist mask 4 remains, the second insulating film 5 is formed to ensure insulation of the sensor wall surface and the magnetic film 6 functioning as a domain control film is formed.

(8-2) The lift-off process is performed to remove unnecessary parts of the second insulating film 5 and the magnetic film (domain control film) 6. As a result, the second insulating film 5 and the magnetic film (domain control film) 6 are disposed only in the etching area for track forming 41.

(8-3) The third insulating film 10 is formed on the first insulating film 8.

(8-4) The upper shield 11 is formed.

Figure 1:
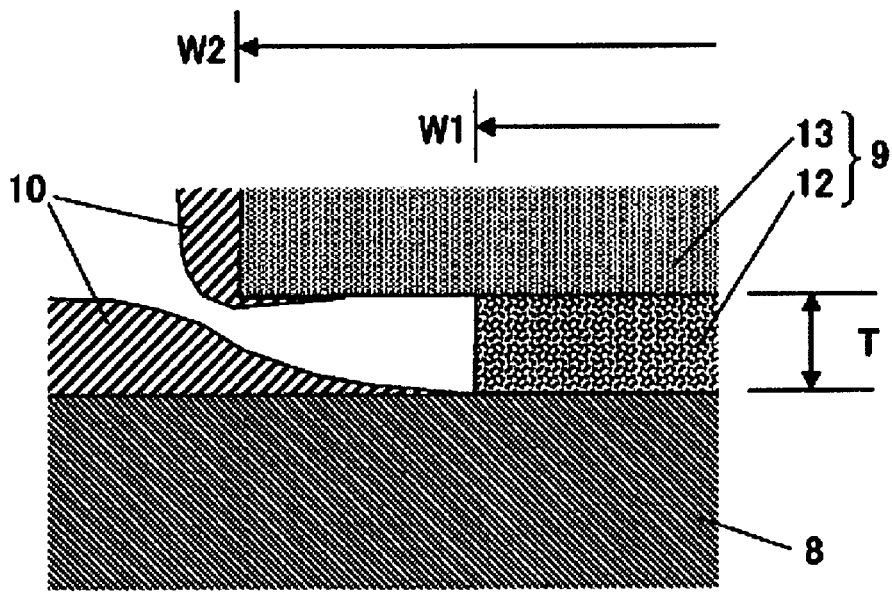
FIG. 1 is an explanatory diagram showing a fabrication process for a conventional CPP-type head.
Figure 1:
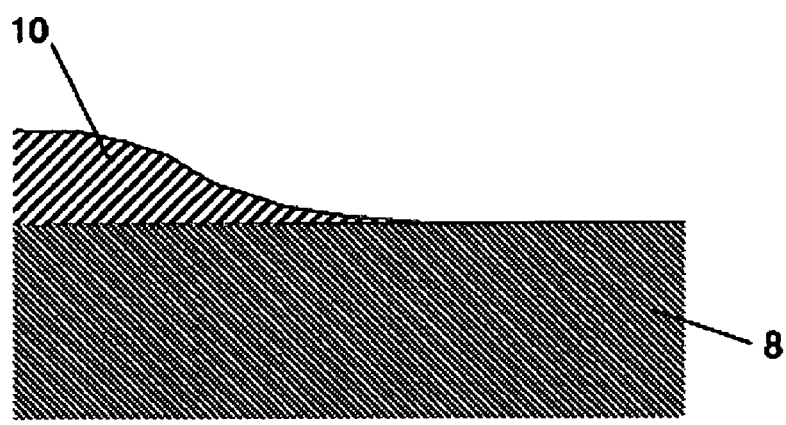

The fabrication process according to the invention differs from the conventional method as shown in FIGS. 1 and 2 in that the track width and the stripe-height direction are fabricated in a different order. While the conventional example forms the track width first, the invention forms the stripe-height direction first. Therefore, the stripe-height formation resist mask 7 can be formed on a flat portion. The shape defect (portion E) in FIG. 5 does not occur. It is possible to prevent occurrence of a shape defect in the stripe-height direction of the sensor film 3 and ensure the dimensional accuracy and the accuracy of an edge position in the stripe-height direction. The accuracy of a base point to ABS (throat-height zero point) can be ensured even after lapping of ABS. Ensuring the reference positional accuracy can ensure the positional accuracy of the write head to be used in combination. As a result, the remote host performance can be stabilized. The write head stabilization is especially important when an in-plane write head is changed to a perpendicular write head.

Portion A in FIG. 2 ((2-1*a*) according to the prior art may short-circuit the lower shield 1 and the magnetic film (domain control film) 6 when a re-deposition from the lower shield 1 is formed on the second insulating film 5. This is partly because the second insulating film 5 to be etched is thin. At portion G in FIG. 7 (7-4*a*) or FIG. 8 (8-1*a*) according to the present invention, an insulating film to be etched is the first insulating film 8 and is thicker than the second insulating film 5, making it difficult to cause short-circuiting due to re-deposition from the lower shield 1. The second insulating film 5 as a thin insulating film is not etched differently from FIG. 2, with no possibility of a damage.

The process in FIG. 7 (7-4) forms portion G and etches a track portion and is one of most critical processes that may cause short-circuiting at the wall surface of the sensor film 3. No short-circuiting will occur at portion G under a condition of causing no short-circuiting at the wall surface of the sensor film 3. For example, re-deposition and the like can be prevented by etching the etching wall surface in a tapered form as shown in FIG. 7 (7-4*a*). While the diagram shows the straight taper, it may be shaped to contain a smooth curve. As an alternative method, an oxidation process may be performed to insulate the re-deposition if it is formed slightly.

Figure 5:
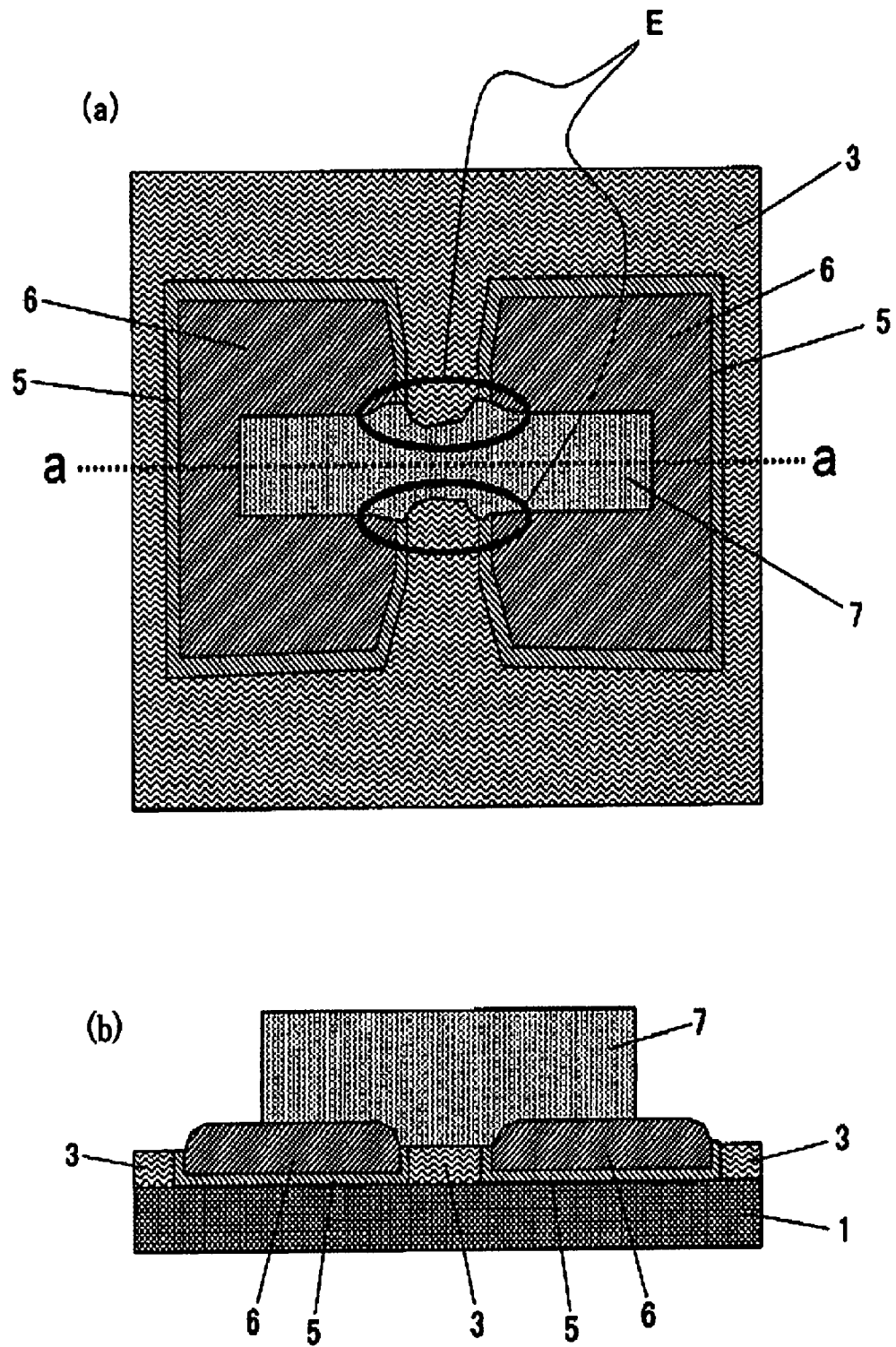
FIG. 5 is a diagram showing a problem in the conventional fabrication process.

Since the manufacturing sequence according to an embodiment of the present invention includes the track formation after the stripe-height formation, there might be a possibility of degrading the dimensional accuracy of the track width. For example, however, the upper surface of the first insulating film 8 may be aligned to the upper surface of the sensor film 3. In this manner, it is possible to protect the track formation resist mask 4 against a shape defect and ensure the dimensional accuracy. Since the invention forms a track after completion of the stripe-height formation, the magnetic film 6 can be designed to have any film thickness. The thickness of the magnetic film 6 often needs to be adjusted to some extent for characteristics stabilization. Embodiments in accordance with the present invention provide a wide margin in terms of the head design. According to the prior art, changing the magnetic film 6 to any thickness causes a difference between upper surface positions of the sensor film 3 and the magnetic film 6, easily resulting in the problem as shown in FIG. 5.

As shown in FIG. 8 (8-3*a*), disposing the third insulating film 10 having the smoothly shaped wall surface can increase the distance between the lower shield 1 and the upper shield 11 as electrodes. The upper shield 11 can be smoothly shaped. This is similar to the effect as described with reference to FIG. 6.

As described with reference to FIG. 6, the third insulating film 10 is disposed outside the second insulating film 5. This structure makes it possible to effectively use the function of the magnetic film 6 whether it is a domain control film or a side-shield film. Since the third insulating film 10 is disposed outside the second insulating film 5, this structure does not cover the edge differently from portion D in FIG. 4, leaving a possibility of short-circuiting. However, the invention employs the structure as if the second insulating film 5 goes aground the first insulating film 8. The fabrication process does not etch the second insulating film 5. It is possible to prevent short-circuiting even though the third insulating film 10 does not cover portion F in FIG. 6.

Figure 9:
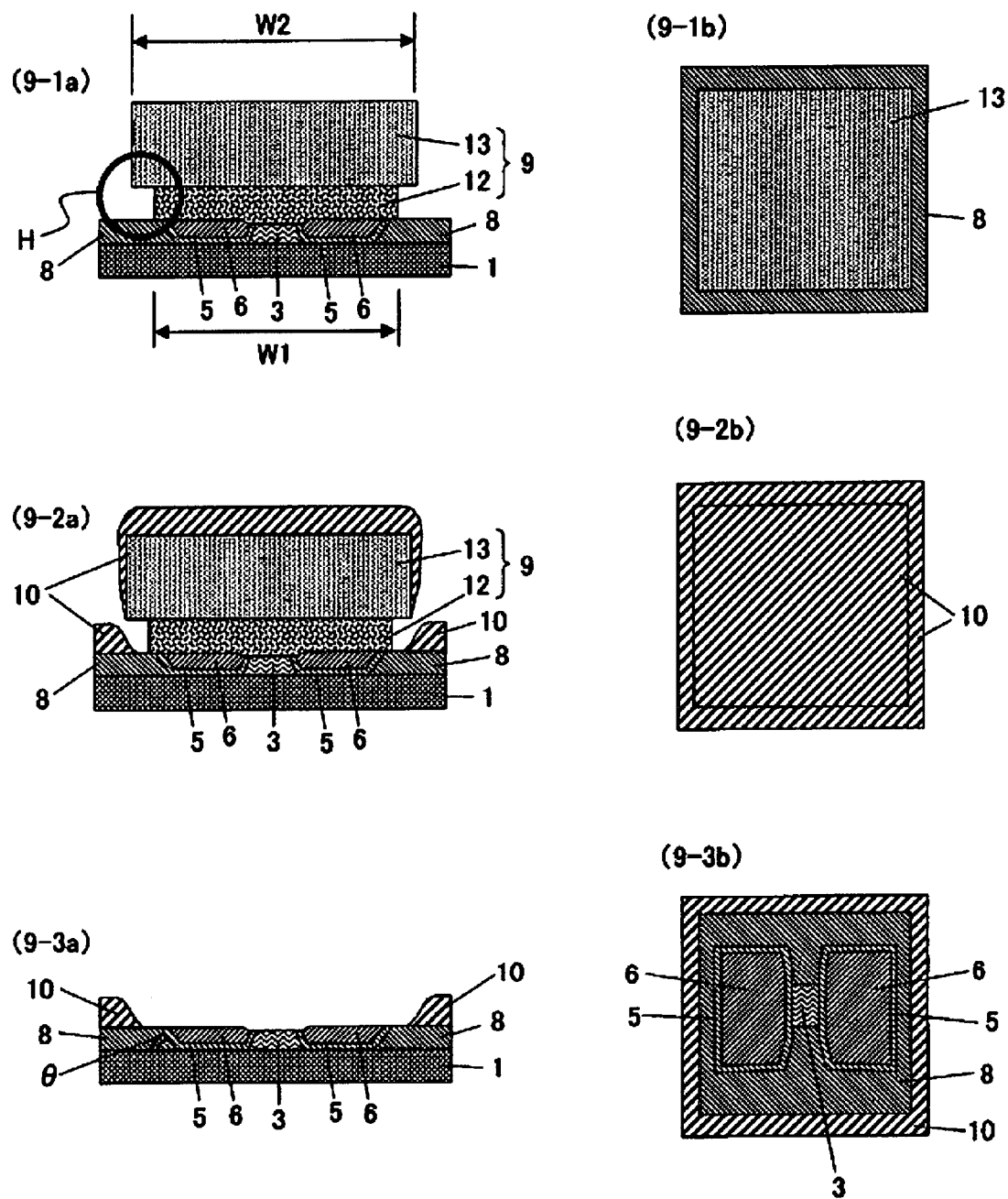
FIG. 9 is a diagram exemplifying the fabrication process of the read head according to an embodiment of the present invention.

FIG. 9 shows a method of forming the third insulating film as another embodiment of the read head fabrication process according to the present invention. FIG. (9-1*a*) is a cross sectional view of FIG. (9-1*b*). The same applies to the subsequent diagrams.

(9-1) A lower resist 12 and an upper resist 13 are formed as the resist pattern 9 for forming the third insulating film. In the drawing, W1 denotes the width of the lower resist and W2 denotes the width of the upper resist in the track-width direction. As seen from the drawing, W2 is greater than W1. Portion H has an undercut.

(9-2) The third insulating film 10 is formed. Since the resist pattern 9 has the undercut at portion H, the third insulating film 10 discontinuously cut at portion H.

(9-3) The lift-off process is performed to remove unnecessary part of the third insulating film 10. This drawing is similar to FIG. 8 (8-3*a*). Though not shown, an upper shield is formed thereafter.

The resist pattern 9 (lower resist 12 and upper resist 13) and the third insulating film 10 differ from the resist construction and the film formation construction used for the conventional track width formation. This is because the track width formation generates a film thinner than the third insulating film 10 and often permits a special lift-off process. The second insulating film 5 and the magnetic film 6 mentioned above normally indicate the thickness of approximately 30 nm to approximately 100 nm in total. Normally, the third insulating film 10 preferably has the thickness of 100 nm or more. However, the lift-off process become difficult as the film thickness increases. The resist structure used for the track formation causes a considerable amount of lift-off remainders, resulting in a failure. The lift-off method for the track formation often uses a lift-off apparatus having a considerably high removal performance. Such lift-off apparatus is considerably expensive and requires a long processing time, resulting in low throughput. A simpler, higher-throughput process is desirable for formation of the noncritical third insulating film 10. Obviously, an etching process needs to be avoided in consideration for a damage to the sensor film 3.

We examined an optimal resist construction used for formation of the third insulating film 10 instead of the resist pattern used for the track formation. Further, we examine a process capable of the normal lift-off process. Tables 1 through 3 show the result.

TABLE 1

Third insulating film thickness of 100 nm

| Lower resist thickness (nm) | 1000 | Fence | Fence | Pattern lost | Pattern lost | Pattern lost |
|---|---|---|---|---|---|---|
| | 500 | Fence | Fence | OK | OK | Pattern lost |
| | 300 | Fence | Fence | OK | OK | OK |
| | 200 | Fence | Fence | OK | OK | OK |
| | 100 | Fence | Fence | OK | OK | OK or fence |
| | 50 | Lift-off remainder | Lift-off remainder | Fence | Fence | Fence |
| | | 1 | 2 | 5 | 10 | 15 |
| | | Undercut ratio ($\{(W2 - W1)/2\}/T$) | | | | |

TABLE 2

Third insulating film thickness of 200 nm

| Lower resist thickness (nm) | 1000 | Fence | Fence | Pattern lost | Pattern lost | Pattern lost |
|---|---|---|---|---|---|---|
| | 500 | Fence | Fence | OK | OK | Pattern lost |
| | 300 | Fence | Fence | OK | OK | OK |
| | 200 | Fence | Fence | OK | OK | OK or fence |
| | 100 | Lift-off remainder | Lift-off remainder | Fence | Fence | Fence |
| | 50 | Lift-off remainder | Lift-off remainder | Fence | Fence | Fence |
| | | 1 | 2 | 5 | 10 | 15 |
| | | Undercut ratio ($\{(W2 - W1)/2\}/T$) | | | | |

TABLE 3

Third insulating film thickness of 500 nm

| Lower resist thickness (nm) | 1000 | Fence | Fence | Pattern lost | Pattern lost | Pattern lost |
|---|---|---|---|---|---|---|
| | 500 | Fence | Fence | OK | OK | Pattern lost |
| | 300 | Lift-off remainder | Lift-off remainder | Lift-off remainder or fence | Lift-off remainder or fence | Lift-off remainder or fence |
| | 200 | Lift-off remainder | Lift-off remainder | Lift-off remainder | Lift-off remainder | Lift-off remainder |
| | 100 | Lift-off remainder | Lift-off remainder | Lift-off remainder | Lift-off remainder | Lift-off remainder |
| | 50 | Lift-off remainder | Lift-off remainder | Lift-off remainder | Lift-off remainder | Lift-off remainder |
| | | 1 | 2 | 5 | 10 | 15 |
| | | Undercut ratio ($\{(W2 - W1)/2\}/T$) | | | | |

Table 1 will be described. The lower resist 12 constituting the resist pattern 9 has thickness T of 50 nm through 1000 nm. It is assumed that the width of the lower resist 12 is W1 and the width of the upper resist 13 is W2. Undercuts are formed so that undercut size ratio $\{(W2-W1)/2\}/T$ ranges from 1 to 15. The undercut is formed at portion H in FIG. 9 (9-1a). Using the resist pattern 9 formed in this manner, the third insulating film 10 is formed with the thickness of 100 nm and the lift-off process is performed. A normal apparatus is used for the lift-off process based on immersion in a remover with ultrasonic.

Figure 10:
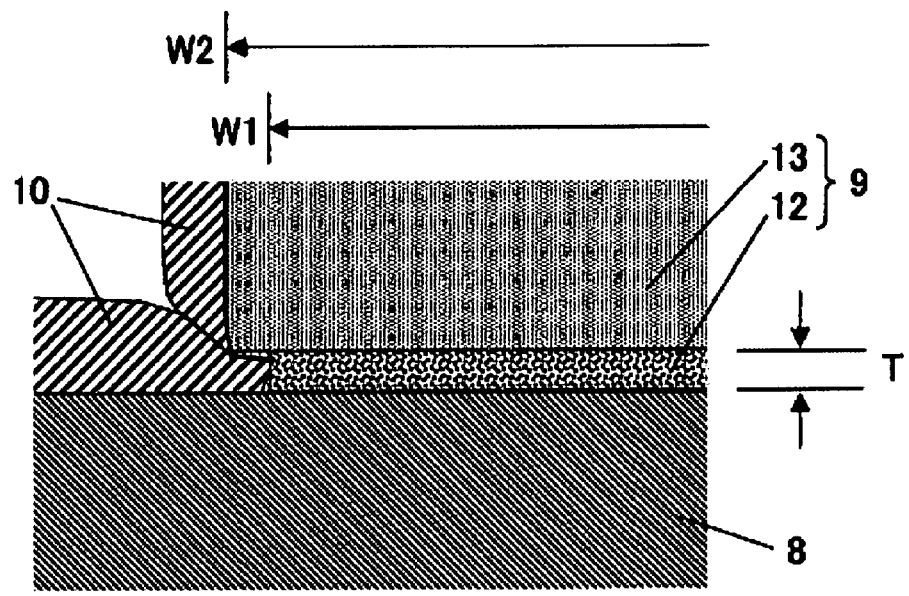
FIG. 10 is a schematic diagram showing a state before an unoptimized lift-off pattern is lifted off.

When the lower resist 12 constituting the resist pattern 9 has the thickness of 50 nm, we observed many cases where the third insulating film 10 is not lifted off and remains (lift-off remainder) or the third insulating film 10, if lifted off, remains outside the pattern in a fence pattern (fence). FIG. 10 schematically shows portion H at this time. The third insulating film 10 completely blocks the undercut portion and prevents the removal solution from penetrating, thus disabling the removal. Even when an ultrasonic shock is applied for removal, the third insulating film remains in a fence pattern.

When the lower resist 12 constituting the resist pattern 9 has the thickness of 100 nm, occurrences of fence were confirmed at a small aspect ration of undercut of 1 or 2, but were hardly observed at an aspect ration of undercut of 5 through 10. FIG. 12 schematically shows portion H at this time. The third insulating film 10 is separated at the undercut portion to be discontinuous. The removal solution penetrates here to enable the removal. FIG. 13 is a schematic diagram showing the shape after the removal. We succeeded in forming the third insulating film 10 having a smoothly transformed wall surface.

Figure 11:
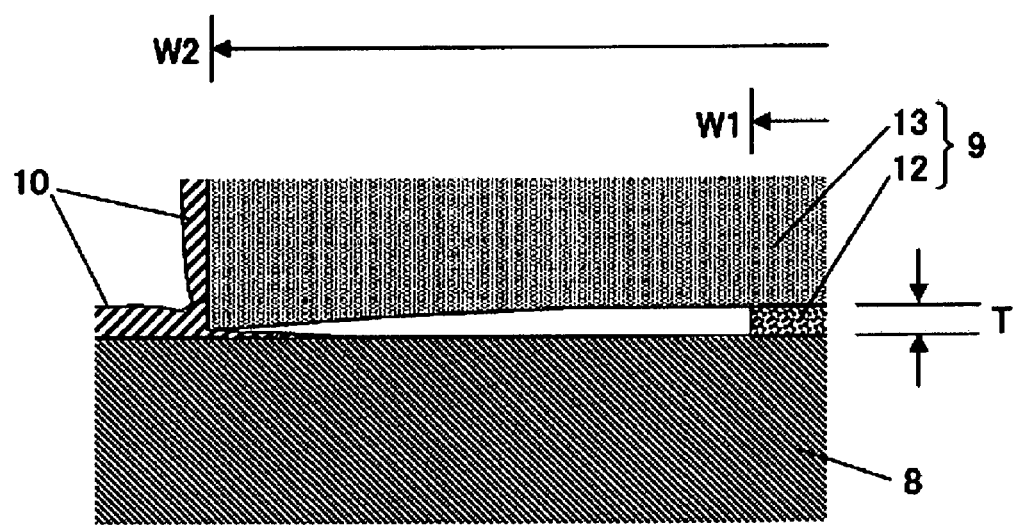
FIG. 11 is a schematic diagram showing a state before an unoptimized lift-off pattern is lifted off.

Further increasing the undercut ratio to 15 caused a few occurrences of fence. FIG. 11 shows a schematic diagram before the lift-off process. A large undercut exhibited a contact at an undercut tip. A possible reason is that too long an undercut causes a distortion due to heat during the process and cannot be supported to allow the upper resist 13 to fall. As a result, we observed an occurrence of fence after the lift-off process. When the lower resist 12 constituting the resist pattern 9 has the thickness of approximately 200 nm to approximately 1000 nm, a fence was observed at an undercut ratio of 1 or 2 similarly to the film thickness of 100 nm for the lower resist 12. A possible reason is a failure to form a portion for separating the third insulating film 10 at portion H.

When the undercut ratio ranges from 5 to 10, a fence or a lift-off remainder is hardly observed to almost result in OK except the lower resist thickness of 1000 nm. When the lower resist thickness is 1000 nm, the pattern is lost at the undercut ratio of 5 or more. A possible reason is that the remaining part of the lower resist 12 becomes small to decrease an adhesion strength of the pattern. A similar result is observed when the thickness of the lower resist 12 is 500 nm at the undercut ratio of 15.

Tables 2 and 3 show results of changing the third insulating film thickness to 200 nm and 500 nm. The results can be seen in the same manner as Table 1.

Based on these results, we found that the thickness of the lower resist 12 needs to be approximately equal to that of the third insulating film. We also found that an optimal undercut ratio ranges from 5 to 10. It only needs to satisfy a condition of $5 \leq \{(W2-W1)/2\}/T \leq 10$, where W2 is the upper resist width, W1 is the lower resist width, and T is the lower resist film thickness. The thickness of the third insulating film 10 preferably lies in the range of approximately 100 nm to approximately 500 nm. The reason is that the film thickness is preferably greater than that for track formation and that too large a thickness may cause an adverse effect concerning the process stability or throughput. In consideration for this, it is more preferable that the above-mentioned condition satisfies $0.1 \ \mu m \leq T \leq 0.5 \ \mu m$ and $0.5 \ \mu m \leq (W2-W1)/2 \leq 5 \ \mu m$. The condition greatly differs from the resist construction for track formation according to the prior art. Since the resist construction according to the invention is not used for track formation, a pattern is formed so that the length in the track-width direction is greater than the pattern width for forming the track width. There is no need for strict accuracy of pattern dimensions.

Figure 14:
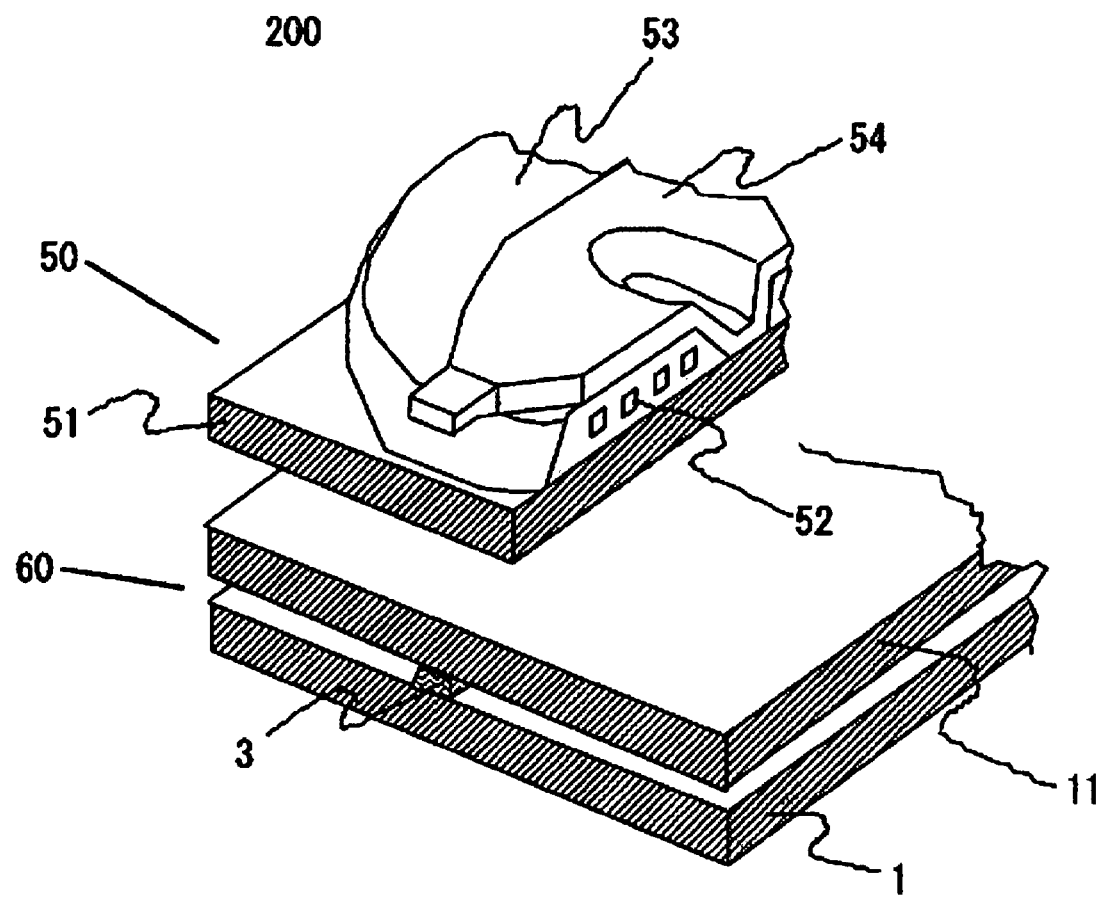
FIG. 14 is a schematic diagram showing a magnetic head.
Figure 1:
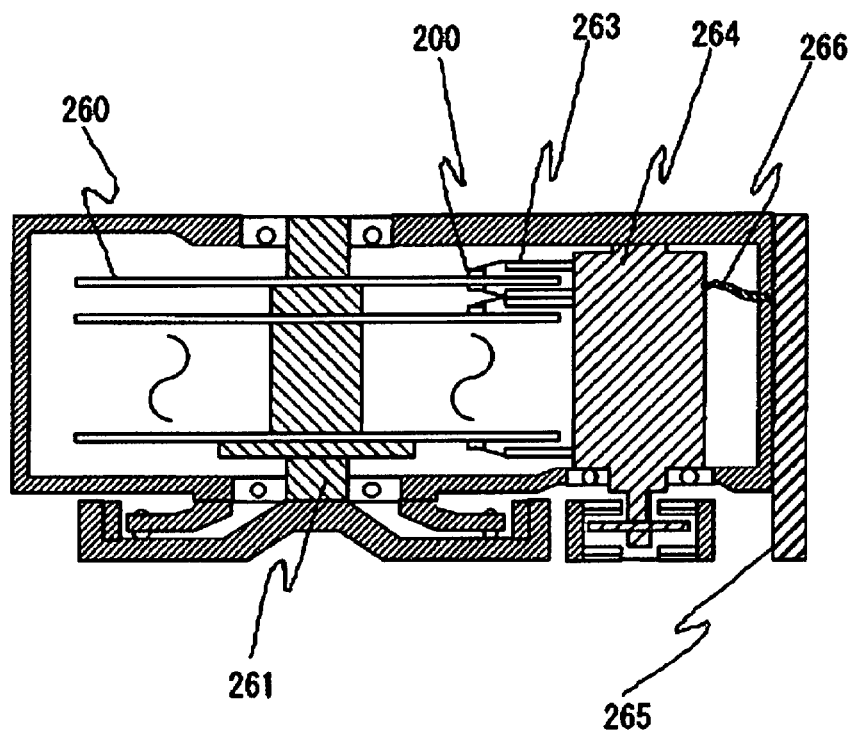
Figure 1:
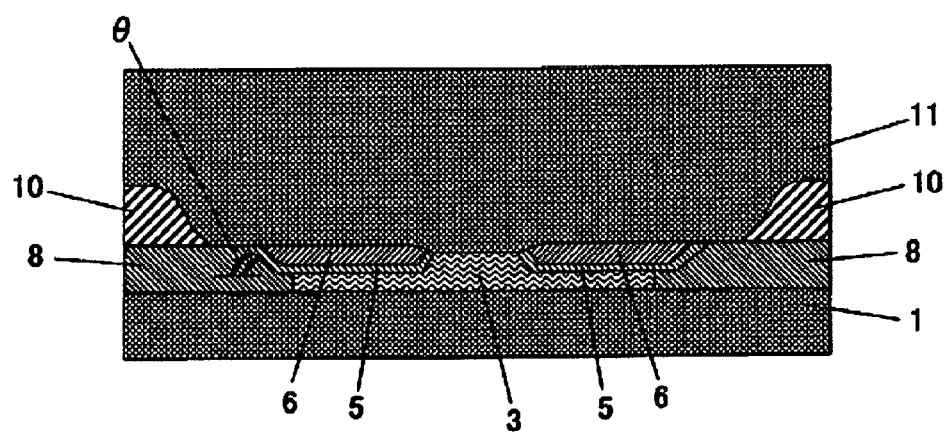

FIG. 14 a schematic diagram of a magnetic head according to the invention. A magnetic head 200 includes a read head 60 and a write head 50. The write head 50 is structured so as to be compliant with perpendicular magnetic recording and includes a sub pole 51, a coil 52, a coil insulator 53, and a main pole 54. A write head for in-plane recording can be used for the write head 50. The read head 60 is equivalent to the thin film magnetic head described in the above-mentioned embodiment. The drawing shows only the lower shield 1, the sensor film 3, and the upper shield 11 and omits the other components. The magnetic head according to embodiments of the present invention provides the above-mentioned effect and can prevent a shape defect and short-circuiting and improve a yield. The recording density can be improved since the side shield structure is employed. The frequency characteristics can be improved since an electrostatic capacity is reduced between the upper and lower shields.

FIG. 15 is a schematic diagram showing a magnetic disk unit constructed to use the magnetic head 200 as shown in FIG. 14. The magnetic disk unit includes a magnetic disk 260, a spindle motor 261, a voice coil motor 264, gimbals 263, a magnetic head 200, a wiring 266, and a signal processing circuit 265. The use of the thin film magnetic head according to the invention can improve the recording density and the frequency characteristics compared to the prior art.

Figure 18:
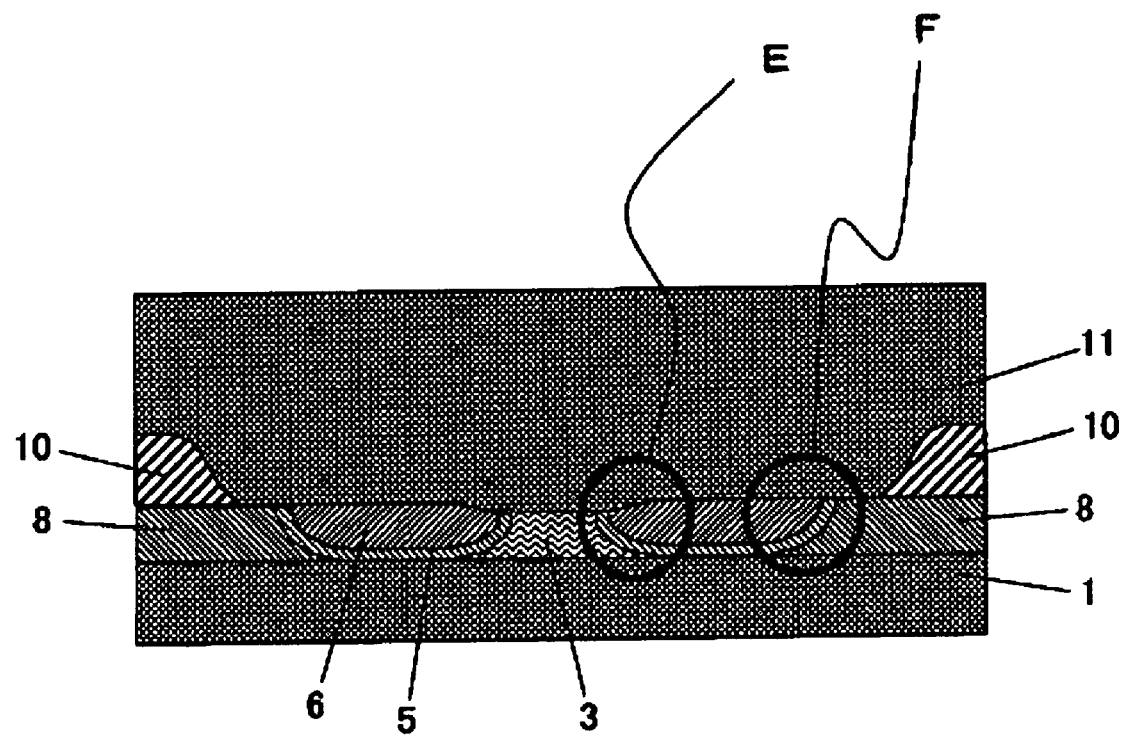
FIG. 18 is a diagram showing a modification of the read head according to an embodiment of the present invention.

While specific embodiments in accordance with the present invention have been described above, various modifications may be made based on the above-mentioned basic technical concept of the invention. For example, FIG. 6(a) shows the example of the straight tapered etching wall surface of the sensor film 3 during track formation. There may be provided multiple tapers or a smoothly changing curved wall surface as shown in FIG. 18. This shape can improve adhesion of the second insulating film 5 and the magnetic film 6. This etching shape is also effective in the stripe-height direction.

While there has been described the example of performing etching up to the lower shield during formation of the track width and the stripe-height, it is possible to combine a method of not performing etching up to the lower shield during formation of the track width and the stripe-height. As shown in FIG. 16, for example, it may be preferable to use a technique of partway etching the sensor film 3 without etching it up to the lower shield 1 during track formation. Also in this case, it is possible to not only provide the effect according to the invention, but also decrease an element resistance and improve magnetic stability of the sensor film 3.

Figure 17:
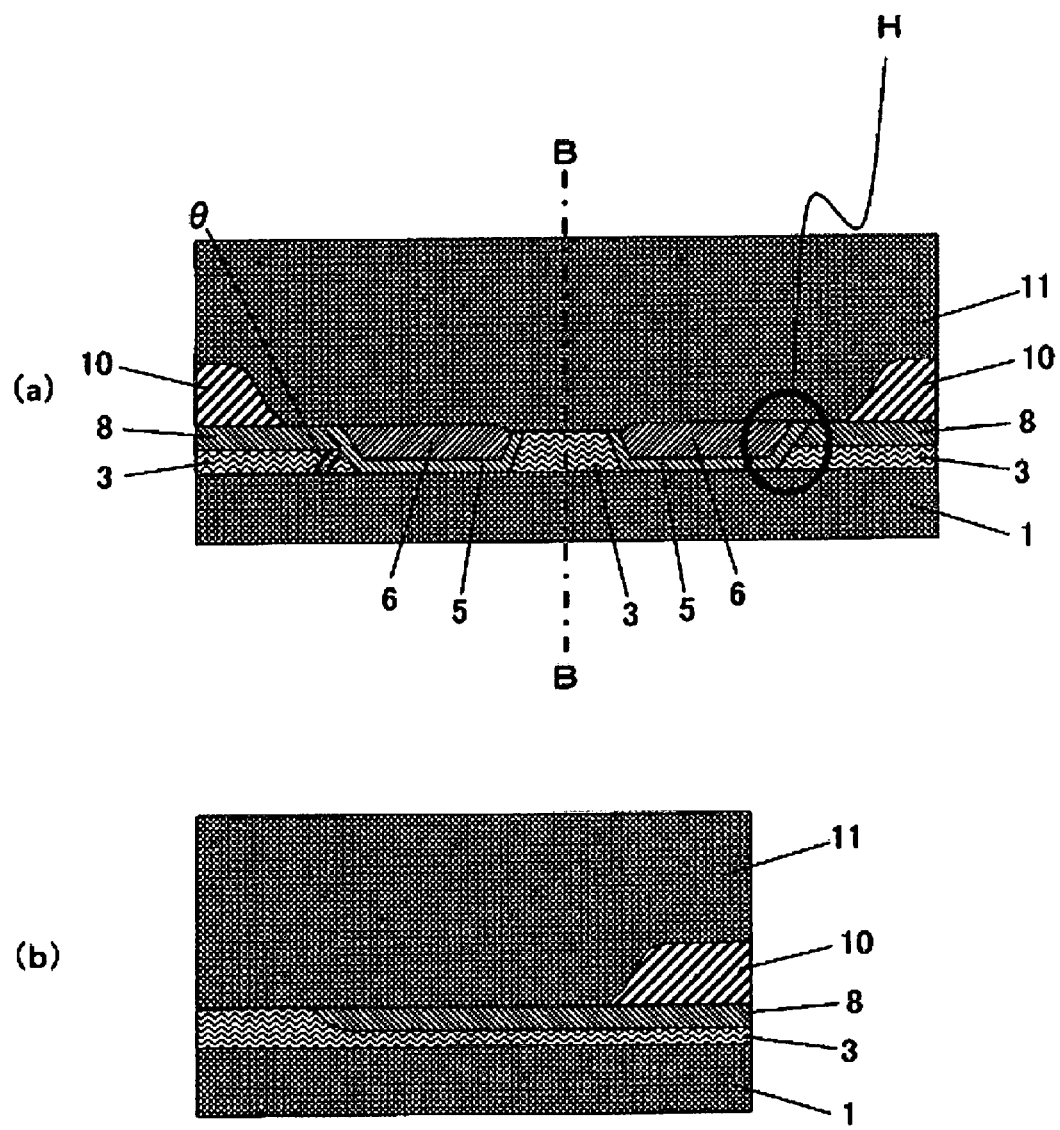
FIG. 17 is a diagram showing a modification of the read head according to an embodiment of the present invention.

FIG. 17 shows an example of partway etching the sensor film 3 in the stripe-height direction without performing etching up to the lower shield 1. FIG. 17(a) shows an ABS shape. FIG. 17(b) is a cross sectional view taken on the line B-B in FIG. 17(a). In FIG. 17(b), a bottom part of the sensor film 3 remains unetched. In this case, the upper edge of the etched sensor film 3 defines an actual stripe-height. Although the first insulating film 8 becomes thinner than that described in FIG. 6, the invention can use the third insulating film 10 to extend the distance between the upper and lower shields. It is possible to reduce an increase in the electrostatic capacity due to thinning of the first insulating film 8. Also in this case, it is possible to not only provide the effect according to the invention, but also decrease an element resistance and improve magnetic stability of the sensor film 3.

No detailed description has been given to the construction of the sensor film 3. The effect of the invention is unchanged so long as a device supplies the sensor film 3 with a detection current in a perpendicular direction. The domain control film or the side-shield film used for the magnetic film 6 may be provided with a cap film as a protective film or an under layer for improving characteristics. An under layer 11 may be provided for the bottom of the upper shield 11 for improving cohesiveness or adjusting an interval between shields.

While the present invention has been described with reference to specific embodiments, those skilled in the art will appreciate that different embodiments may also be used. Thus, although the present invention has been described with respect to specific embodiments, it will be appreciated that the present invention is intended to cover all modifications and equivalents within the scope of the following claims.

What is claimed is:

1. A thin film magnetic head comprising:
    a sensor film;
    a pair of an upper shield and a lower shield for applying an electric current in a film thickness direction of the sensor film;
    a pair of second insulating films formed adjacently to both sides of the sensor film in a track-width direction;
    a pair of magnetic films that are formed at both sides of the sensor film in the track-width direction and are adjacent to the second insulating film;
    a first insulating film disposed outside the second insulating film in a track-width direction of the sensor film;
    and a third insulating film disposed immediately adjacent the upper shield and the first insulating film and between the upper shield and the first insulating film,
    wherein, on an air bearing surface, the second insulating film is adjacent to both wall surfaces in a track direction of the pair of magnetic films and the third insulating film is disposed outside the second insulating film in the track direction, and wherein the second insulating film is raised toward and touches the upper shield where the second insulating film meets the first insulating film.

2. The thin film magnetic head according to claim 1, wherein the pair of magnetic films are hard-magnetic films.

3. The thin film magnetic head according to claim 1, wherein the pair of magnetic films are soft-magnetic films.

4. The thin film magnetic head according to claim 1, wherein an angle of 90° or smaller is formed between an outside edge of the second insulating film and a surface of the lower shield on an air bearing surface.

5. The thin film magnetic head according to claim 1, wherein the third insulating film has no corner at an upper shield side.

* * * * *